United States Patent
Fiorentino et al.

(10) Patent No.: US 8,437,172 B2
(45) Date of Patent: May 7, 2013

(54) DECODERS USING MEMRISTIVE SWITCHES

(75) Inventors: Marco Fiorentino, Mountain View, CA (US); William M. Tong, San Francisco, CA (US); Philip J. Kuekes, Menlo Park, CA (US); Jianhua Yang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 164 days.

(21) Appl. No.: 13/142,580

(22) PCT Filed: Jan. 30, 2009

(86) PCT No.: PCT/US2009/032721
§ 371 (c)(1), (2), (4) Date: Jun. 28, 2011

(87) PCT Pub. No.: WO2010/087852
PCT Pub. Date: Aug. 5, 2010

(65) Prior Publication Data
US 2011/0267870 A1  Nov. 3, 2011

(51) Int. Cl.
G11C 8/10 (2006.01)

(52) U.S. Cl.
USPC ............. 365/148; 365/163; 365/230.06

(58) Field of Classification Search .......... 365/239
See application file for complete search history.

(56) References Cited

U.S. PATENT DOCUMENTS

| | | |
|---|---|---|
| 5,355,346 A | 10/1994 | Shin et al. |
| 5,544,125 A | 8/1996 | Yokoyama et al. |
| 6,243,318 B1 | 6/2001 | Yoshihara |
| 7,724,582 B2 * | 5/2010 | Cho ............... 365/185.23 |

* cited by examiner

Primary Examiner — Tan T. Nguyen

(57) ABSTRACT

A decoding structure employs a main terminal (130), a first memristive switch (112) connected between the main terminal (130) and a first addressable terminal (132), and a second memristive switch (114) connected between the main terminal (130) and a second addressable terminal (134). The second memristive switch (114) is oriented so that a voltage polarity on the main terminal (130) that tends to turn the first memristive switch (112) on tends to turn the second memristive switch (114) off.

15 Claims, 4 Drawing Sheets

US 8,437,172 B2

DECODERS USING MEMRISTIVE SWITCHES

BACKGROUND

U.S. Pat. App. Pub. No. 2008/0090337, entitled "Electrically Actuated Switch," to R. Stanley Williams describes a switch that changes between high-conductivity state and a low-conductivity state as a result of internal ion movement. The switch can effectively act as a memristor having a memristance that depends on the total current that has passed through the switch. Operation of these types of switches generally rely on behavior of nanoscale materials, particularly, the interaction of a primary material such as titanium dioxide ($TiO_2$) and a source material such as $TiO_{2-x}$ that contains dopants (e.g., oxygen vacancies). When the primary material and the source material are between two electrodes and a sufficient bias voltage is applied, an electric field can move dopant ions between the primary material and the source material and can drastically change the electrical characteristics of the primary material. In particular, dopant ions flowing into an intrinsic primary material make the primary material significantly more conductive, and dopant ions flowing out of the primary material can return the primary material to its intrinsic non-conductive state.

In another area of technology, many circuits such as multiplexers, volatile and non-volatile memories, video displays, and imaging and detector arrays commonly require decoding circuits that can decode a multi-bit address signal and select a device or a signal line. Signals can then be applied to or received from the selected device or signal line, for example, for operations such as reading or writing of data or simply to direct a signal to or from the correct target. A variety of circuits implementing address decoding are known to accommodate both multi-bit addresses that are transmitted in parallel on multiple lines of an address bus and multi-bit addresses that are serially transmitted on a single line. Typically, decoders for serial address signals use latches, flip-flops, or other storage devices to retain address bits that are then applied in parallel to decoding logic.

BRIEF DESCRIPTION OF THE DRAWINGS

Use of the same reference symbols in different figures indicates similar or identical items.

DETAILED DESCRIPTION

In accordance with an aspect of the invention, a tree structure containing memristive switches can decode a serial signal representing a multi-bit address and provide an electrical connection between the line or terminal receiving the serial address and a line, terminal, or device corresponding to the multi-bit address. In particular, a decode tree can be made of multiple levels of three-way switches, where each three-way switch contains a pair of memristive switches. Each bit of a serial address signal causes a three-way switch in a corresponding level of the tree structure to switch into one of two conductive states and thereby select one of the three-way switches in the next level of the tree for application of the next bit in the address. A tree structure including N levels of the three-way switches can thus decode an N-bit serial address and create any of $2^N$ available conductive paths or connections. The tree structures can be integrated into a compact integrated circuit with feature sizes as small as tens of nanometers or smaller.

Figure 1:
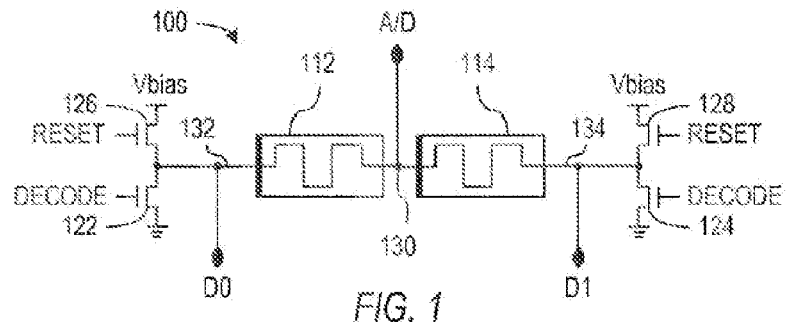
FIG. 1 shows a three-way switch in accordance with an embodiment of the invention employing back-to-back memristive switches.

FIG. 1 shows a three-way switch 100 in accordance with an embodiment of the invention. Switch 100 includes memristors or memristive switches 112 and 114 and transistors 122, 124, 126 and 128. A main terminal A/D to which a control or address signal can be applied to switch 100 is coupled to a node 130 between switches 112 and 114. Memristive switches 112 and 114 are oriented so that a sufficient voltage of one polarity (e.g., a negative polarity voltage) applied to node 130 will turn ON memristive switch 112 and turn OFF memristive switch 114, and a sufficient voltage of the opposite polarity (e.g., a positive polarity voltage) applied to node 130 will turned OFF memristive switch 112 and turn ON memristive switch 114.

A node 132 at an end of switch 112 opposite to node 130 is connected to a first addressable terminal D0, and a node 134 at an end of switch 114 opposite to node 130 is connected to a second addressable terminal D1. Transistor 122 is connected between node 132 and ground, and transistor 126 is connected between node 132 and a negative bias voltage −Vbias. Transistor 124 is connected between node 134 and ground, and transistor 128 is connected between node 134 and a positive bias voltage +Vbias. (The positive and negative bias voltages shown in FIG. 1 and described here illustrate an example of memristive switches using positively charged dopant ions, but alternatively, switches employing negatively charged dopant ions could similarly be used with appropriate changes in the polarities of the applied voltages.)

Switch 100 is a three-way switch and can connect main terminal A/D to addressable terminal D0 or D1. Switch 100 has an OFF-OFF state in which both switches 112 and 114 are non-conductive and terminals A/D, D0, and D1 are electrically isolated from each other. In the OFF-OFF state of switch 100, an address or control signal can be applied to terminal A/D at a high logic level corresponding to positive bias voltage Vbias and corresponding to a one address bit value (e.g., 1) or at a low logic level corresponding to negative bias voltage −Vbias and corresponding to the other address bit value (e.g., 0). At the same time, a signal DECODE can be asserted so that transistors 122 and 124 connect respective nodes 132 and 134 to ground. If the address signal is at the positive bias voltage +Vbias, the voltage drop between node 130 and 132 is in a direction that keeps switch 112 off, but the voltage drop between node 130 and 134 is sufficient and in the proper direction to drive an ion drift that turns on switch 114 within a switching time as short as nanoseconds. However, if the address signal is at the negative bias voltage −Vbias, the voltage drop between node 130 and 132 is in a direction that turns on switch 112, but the voltage drop between node 130 and 134 has a polarity that keeps switch 114 off. The negative address signal thus turns on switch 112 but keeps switch 114 off when the signal DECODE is asserted. In summary, applying a negative (or positive) address signal to terminal A/D while signal DECODE is asserted changes switch 100 from the OFF-OFF state to an ON-OFF state (or an OFF-ON state) and connects main terminal A/D to addressable terminal D0 (or D1.)

Switch 100 can be reset to the OFF-OFF state by asserting a signal RESET. At the same time, the voltage on node 130 may be grounded or floating. Node 130 can be grounded or allowed to float by external circuitry (not shown) that applies a signal to main terminal A/D. Alternatively, a transistor (not shown) could connect node 130 to ground when a signal RESET is asserted. With node 130 grounded, asserting signal RESET while deasserting signal DECODE causes nodes 132 and 134 to respectively be at negative bias voltage −Vbias and positive bias voltage +Vbias. The voltage drop from node 130 to node 132 then turns off switch 112, and the voltage drop from node 134 to node 130 turns off switch 114.

Figure 2:
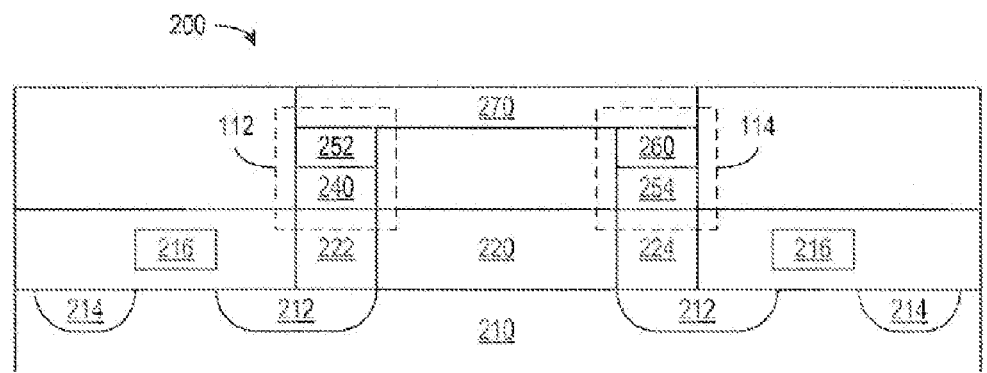
FIG. 2 is a cross-sectional view of an embodiment of the three-way switch of FIG. 1.

FIG. 2 shows a cross-sectional view of a switch structure 200 that is an embodiment of three-way switch 100 of FIG. 1. In switch structure 200, switches 112 and 114 are vertical memristive switches. Switch structure 200 includes a substrate 210, which may be a substrate of silicon or another semiconductor or a thin-film structure containing conventional integrated circuit structures such as transistors, electrical contacts, and electrical interconnects. FIG. 2 shows source/drain regions 212 and 214 of transistors such as transistors 122, 124, 126, and 128 of FIG. 1 in substrate 210. Conductive gates 216 are separated from the channel regions of the transistors by a gate insulator layer that is part of an insulator layer 220. Conductive nodes 222 and 224, which may be metal plugs or traces extending through insulator layer 220, correspond to nodes 132 and 134 and connect to the transistors formed in the underlying structure. The structure formed in substrate 210 and insulator layer 220 can be fabricated using conventional integrated circuit techniques, which are well known in the art.

Memristive switches 112 and 114 in structure 200 overlie insulator layer 220. In one fabrication process, a patterned layer of source material such as $TiO_{2-x}$ is formed to create a region 240. Region 240 is in contact with node 222 and is made of the source material (e.g., $TiO_{2-x}$), which can be grown directly by deposition of the desired material or can be created by deposition of a material that will introduce dopants into a later deposited layer. For example, aluminum or titanium in contact with $TiO_2$ can introduce oxygen vacancies in the $TiO_2$. Regions 252 and 254 of the primary material of memristive switches 112 and 114 can then be formed on dopant source region 240 and node 224, respectively. Region 260 of the source material is then formed on region 254, and a conductive contact 270, which corresponds to node 130 or main terminal A/D in FIG. 1, can be formed to electrically connect memristive switch 112 and 114. Memristive switch 112 includes regions 240 and 252 and has dopant source region 240 away from contact 270, while memristive switch 114 includes regions 254 and 260 and has dopant source region 260 adjacent to contact 270. Assuming use of positive polarity dopants, if contact 270 is at a voltage sufficiently below (or above) the voltage of nodes 222 and 224, dopants from source region 240 (or 260) will flow vertically into primary region 252 (or 254) turning on switch 112 (or 114).

Some processes for fabricating structures in three-way switches are described in more detail below.

Figure 3:
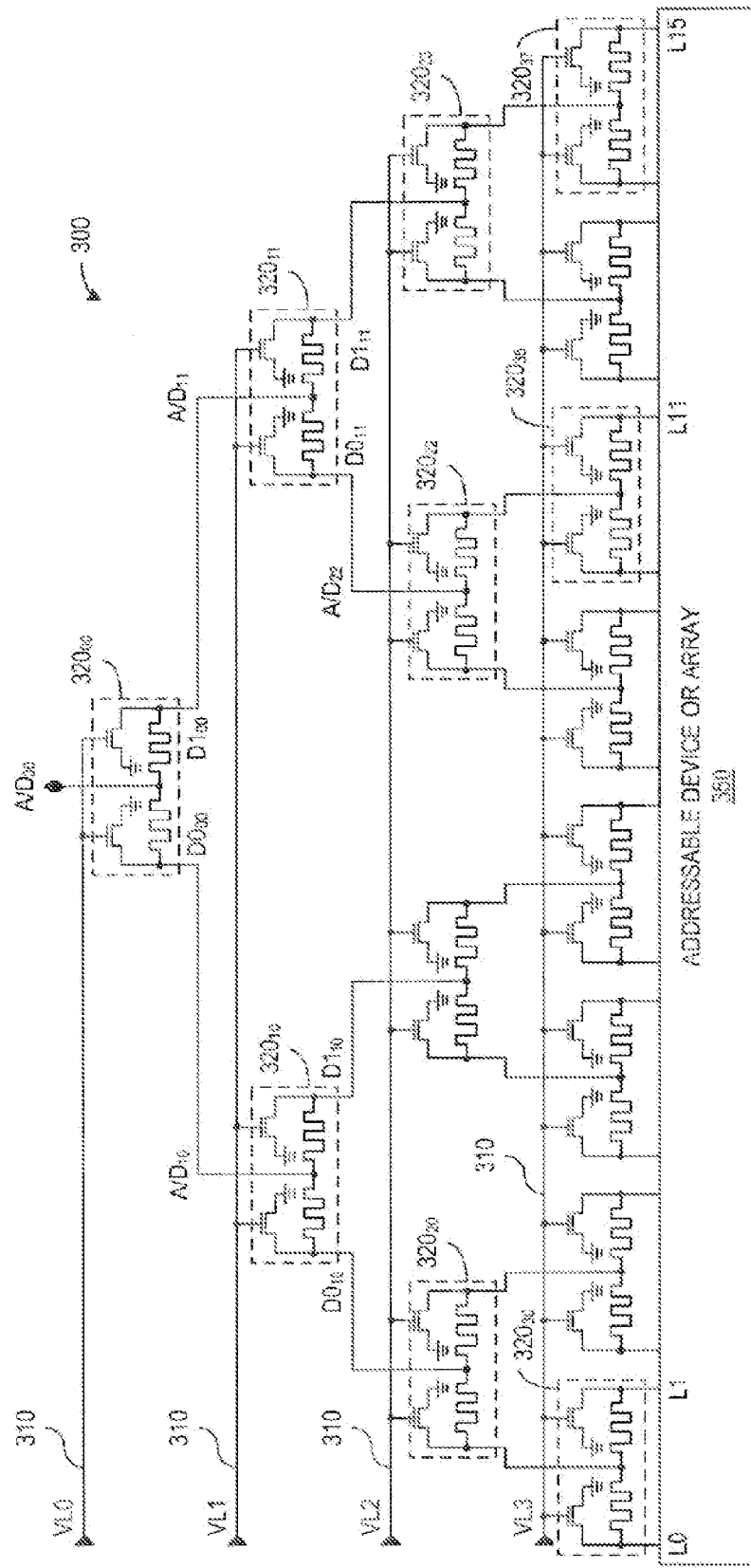
FIG. 3 shows a circuit in accordance with an embodiment of the invention employing a decoder tree of memristive switches for decoding a serial address signal.

Three-way switches such as switch 100 can be combined into a multi-level tree structure for decoding of multi-bit serial addresses. FIG. 3, for example, shows a circuit 300 containing a four-level tree structure of three-way switches generically referred to herein as switches 320. Each switch 320 can be substantially identical to three-way switch 100 of FIG. 1. A root level or level 0 of the tree structure contains a single three-way switch $320_{00}$. Level 1 contains two three-way switches $320_{10}$ and $320_{11}$. Level 2 contains four three-way switches $320_{20}$ to $320_{23}$, and level 3 contains eight three-way switches $320_{30}$ to $320_{37}$. Each level of three-way switches 320 in the tree structure has the gates of grounding transistors (e.g., transistors 122 and 124 in the embodiment of FIG. 1) connected to a level select line 310. Signals VL0, VL1, VL2, and VL3 are applied to level select lines 310 of levels 0, 1, 2, and 3, respectively in FIG. 3. The root level (or level 0) of the tree structure contains a single three-way switch $320_{00}$ that has a main terminal that is the main terminal $A/D_{00}$ of the tree structure. In each level of the tree structure except the last, each switch 320 has addressable terminals connected to the main terminals of switches 320 in the next level. The last level of the tree structure has addressable terminals connected to respective signal lines or devices L0 to L15 in an addressable device or array 350.

Addressable device 350 may be, for example, a volatile and non-volatile memory array, a video display, an imaging array, or a detector array, and the addressable terminals of the last level of the tree structure can connect to row and/or column lines of the array. Alternatively, addressable device 350 can be omitted and the tree structure of circuit 300 can be used as a multiplexer or general decoding circuit.

Figure 4:
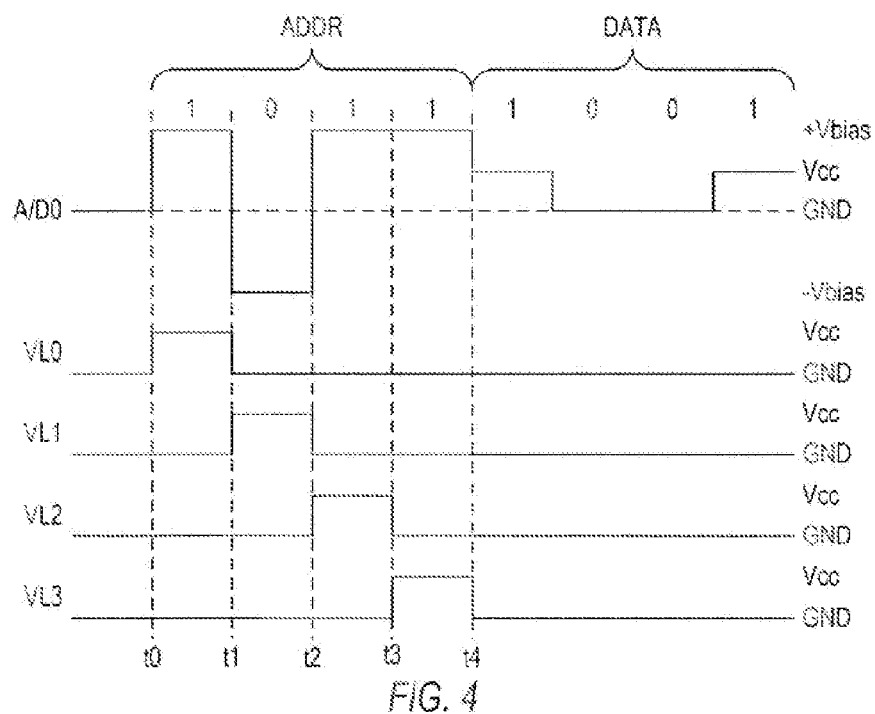
FIG. 4 shows timing diagrams for signals applied to the decoder tree of FIG. 3 during a selection process.

FIG. 4 is a timing diagram of illustrating an operation of circuit 300. The operation can begin with all three-way switches 320 in the OFF-OFF state, which can be achieved level by level using a reset operation such as described below. With the tree structure reset, level select signal VL0 is asserted at an initial time to, and an external circuit (not shown) applies to main terminal $A/D_{00}$ a signal having a level corresponding to a most significant address bit of the line or device to be selected. In the illustrated example, the external signal is initially at positive bias voltage +Vbias, which corresponds to bit value 1 and causes switch $320_{00}$ to transition to the OFF-ON state while signal VL0 is asserted to ground addressable terminals $D0_{00}$) and $D1_{00}$). The switching time for memristive switches typically requires the binary level (+Vbias) to remain for a cycle time on the order of microseconds to nanoseconds.

Level select signal VL0 is deasserted and level select signal VL1 is asserted at time t1 when a next address bit is applied to main terminal $A/D_{00}$. In the example of FIG. 3, switch $320_{00}$ is in the OFF-ON state, so the applied address signal is conducted to the main terminal $A/D_{11}$ of switch $320_{11}$, which is initially in the OFF-OFF state. The second address bit corresponds to bit value 0 or negative bias voltage −Vbias in the example of FIG. 4, so while signal VL1 is asserted, switch $320_{11}$ switches to the ON-OFF state. The state of switch $320_{00}$ is unchanged because the voltage drop across the conductive memristive switch is too small to cause significant switching and because the non-conductive memristive switch is connected to an addressable terminal $D0_{00}$ that is floating. The state of switch $320_{10}$ is unchanged (i.e., OFF-OFF) because the voltage level of the main terminal $A/D_{10}$ of switch $320_{10}$ is floating.

Signal VL1 is deasserted and signal VL2 is asserted at time t2 when the signal applied to main terminal $A/D_{00}$ begins to represent the third address bit. In the example of FIG. 4, the third address bit is 1 and represented by bias voltage +Vbias, and the positive bias voltage +Vbias is conducted through switches $320_{00}$ and $320_{11}$ to switch $320_{22}$. With signal VL2 asserted, the positive bias voltage +Vbias causes switch $320_{22}$ to change from the OFF-OFF state to the OFF-ON state. Other switches in the same level 2 remain in the OFF-OFF state because their main terminals are at voltage levels that float. Switches in the conductive path to switch $320_{22}$ retain their state because the voltage drops across conductive memristive switches are small and because the level select signal VL0 and VL1 are not asserted.

Signal VL2 is deasserted and signal VL3 is asserted at time t3 when the signal applied to main terminal $A/D_{00}$ begins to represent the fourth address bit. In the example of FIG. 4, the fourth address bit is again 1 and represented by bias voltage +Vbias, and the positive bias voltage +Vbias is conducted through switches $320_{00}$, $320_{11}$, and $320_{22}$ to switch $320_{35}$. With signal VL3 asserted, the positive bias voltage +Vbias causes switch $320_{35}$ to change from the OFF-OFF state to the OFF-ON state, providing a conductive path from main terminal $A/D_{00}$ to device or line L11 in addressable device 350. Other switches in the same level 3 remain in the OFF-OFF state because their main terminals are at voltage levels that float. Switches in the conductive path to switch $320_{35}$ retain their state because the voltage drops across conductive memristive switches are small and because the level select signal VL0, VL1, and VL2 are not asserted.

FIG. 4 provides an example of an operation that creates a conductive path from main terminal $A/D_{00}$ to line L11 in addressable device 350. However, through proper selection of the address bits asserted at times t0, t1, t2, and t3, a conductive path can be established through the tree structure from main terminal $A/D_{00}$ to any of lines L0 to L15. More generally, embodiments of the invention having tree structures with N levels can create a conductive path selected from among $2^N$ possible conductive paths. Once the conductive path is created (e.g., at time t4 in FIG. 4) signals can be sent in either direction along the conductive path. FIG. 4 illustrates an example where an external device sends data signals through the tree structure to line L11. The data signals in the example are binary signals having logic levels corresponding with ground and a supply voltage Vcc. Other voltage levels could be employed, but using voltages having magnitudes less than the magnitude of bias voltage Vbias can reduce or avoid the chance of altering the conductive path if data is sent over an extended time. For example, the magnitude of Vbias may be around 1 to 2 volts, while the supply voltage Vcc is around 0.5 volts or less.

A reset operation in preparation of changing the conductive path in a tree structure such as shown in FIG. 3 can be conducted level by level. For example, the conductive path created as described above includes only one switch in each level that is not in the OFF-OFF state, and each switch not in the OFF-OFF state has a conductive path from its main terminal to the root main terminal $A/D_{00}$. Accordingly, if main terminal $A/D_{00}$ is grounded, the conductive switch that is in the top level (e.g., level 3 in FIG. 3) can be switched back to the OFF-OFF state by applying bias voltages −Vbias and +Vbias to respective addressable terminals, e.g., by turning on transistors 126 and 128 in switch 100 of FIG. 1. After all switches in the top level are in the OFF-OFF state, a similar operation can be performed in the next lower level to turn off the one switch that is conductive in that level. The reset operation can then proceed down level by level to the root level.

An alternative reset operation to reset all switches in a level asserts the level select signal in the immediate lower level of the tree structure, which grounds the addressable terminals in the switches of the lower level and therefore grounds the main terminals in the level to be reset. The bias voltages −Vbias and +Vbias are then applied to respective addressable terminals of each device in the level to be reset. This erase operation does not require a conductive path to main terminal $A/D_{00}$ and can be applied when the tree structure is in an unknown state.

Figure 5A:
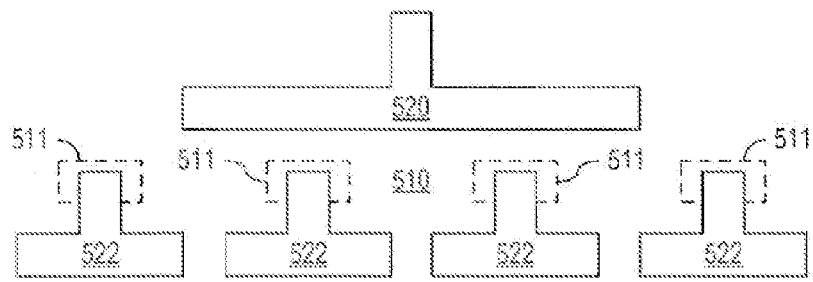
FIGS. 5A, 5B, 5C, and 5D are layout views illustrating a process for fabricating a decoder tree using vertical deposition techniques.

FIGS. 5A to 5D show plan views of structures fabricated to create a decoder tree structure including vertical memristive switches. In particular, FIG. 5A shows a plan view of electrode structures 520 and 522 that can be deposited on a substrate 510 having an insulating surface. Electrodes 520 and 522 can have a feature size (e.g., line width) from hundreds micrometers to tens nanometers and be made of an electrically conductive material such as a metal, e.g., Pt, W, or Cu. Electrode 520 corresponds to a main terminal of a switch at level 0 (i.e., the root level) of the tree structure, and electrodes 522 correspond to the addressable terminals of switches in level 1 of the tree structure and the main terminals of switches in level 2. Optionally, substrate 510 may contain transistors or biasing circuits with contacts 511 positioned to make electrical connection to electrodes 522 for grounding the addressable terminals or applying appropriate bias voltages for switching the state of memristive switches in level 1 during address decoding or reset operations. Transistors (e.g., thin film transistors) may alternatively or additionally be formed in overlying structures (not shown).

Figure 5B:
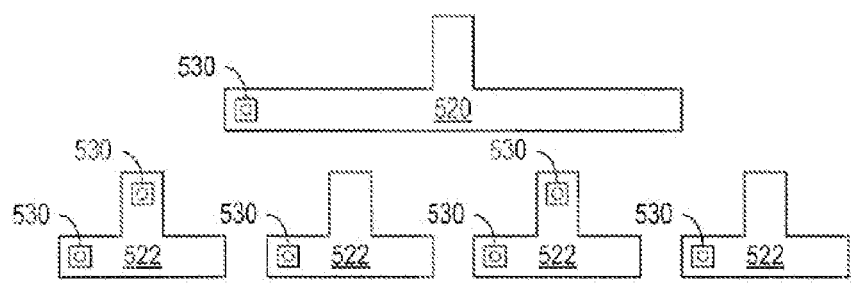

FIG. 5B shows regions 530 that are selectively deposited on electrode structures 520 and 522 in areas where a first set of memristive switches are desired. Selective deposition can be accomplished, for example, using a shadow mask or conventional photolithography techniques. In an illustrative embodiment, switches in the first set are switched on by upward ion drift. A blanket deposit of a primary material for the memristive switches is deposited over electrodes 520 and 522 and regions 530. In an exemplary embodiment of the invention, the primary material is titanium dioxide ($TiO_2$), which can be deposited to a thickness of from 3 nm to about 1000 nm, and regions 530 can be from about 100 μm to 10 nm in lateral dimensions and made of titanium (Ti) that is less than about 50 nm thick. Titanium in regions 530 can create oxygen vacancies of regions of $TiO_{2-x}$ in the overlying intrinsic titanium dioxide ($TiO_2$).

Figure 5C:
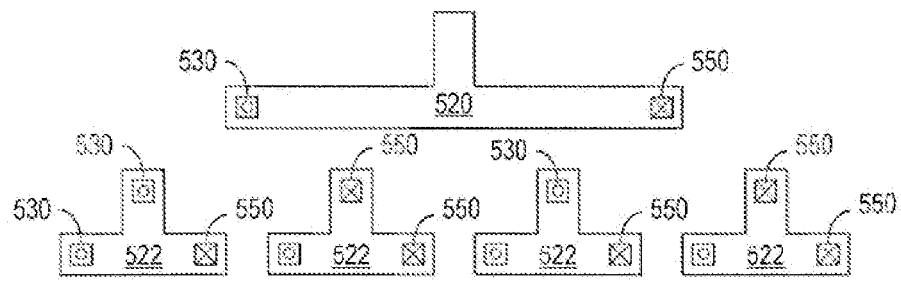

FIG. 5C shows regions 550 that are selectively deposited on the blanket layer of primary material overlying electrode structures 520 and 522. Regions 550 are in areas where a second set of memristive switches are desired. In an illustrative embodiment, switches in the second set are switched on by downward ion drift. In the exemplary embodiment, regions 550 can be from about 100 μm to 10 nm in lateral dimensions and made of titanium (Ti) that is less than about 50 nm thick. Titanium in regions 550 can create oxygen vacancies of regions of $TiO_{2-x}$ in the underlying intrinsic titanium dioxide ($TiO_2$).

Figure 5D:
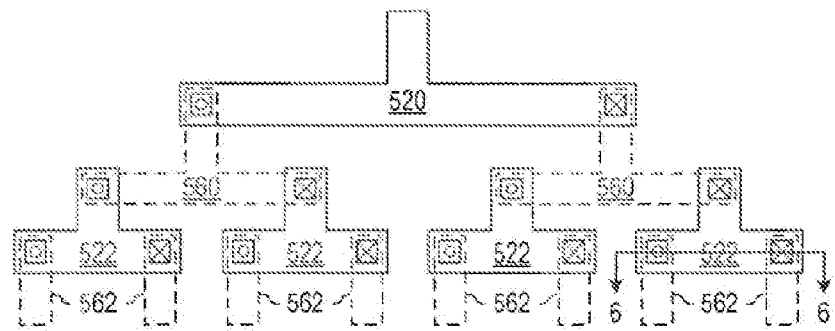

FIG. 5D shows a plan view of electrode structures 560 and 562 that can be selectively deposited on the structure of FIG. 5C. Electrodes 560 and 562 can have a feature size (e.g., line width) of about 3 nm to about 1000 nm and can be made of an electrically conductive material such as a metal, e.g., Pt, W, or Cu. Electrodes 560 correspond to addressable terminals of the three-way switch at the root level of the tree structure and main terminals of switches at level 1 of the tree structure, and electrodes 522 correspond to the addressable terminals of switches in level 2 of the tree structure and may be the main terminals of switches at a higher level (not shown). Optionally, transistors (e.g., thin film transistors) may be formed in overlying structures (not shown) that are in electrical contact with electrodes 560 and 562.

Figure 6:
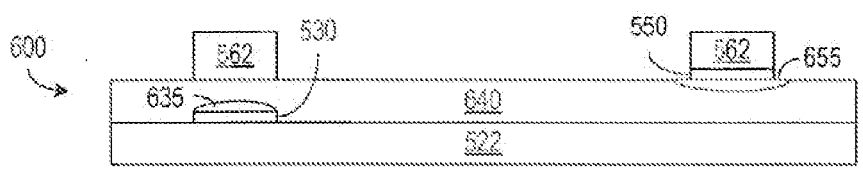
FIG. 6 shows a cross-sectional view of a portion of the structure illustrated in FIG. 5D.

FIG. 6 shows a cross-sectional view of a three-way switch 600 formed in a portion of structure of FIG. 5D indicated by the section line 6-6. Switch 600 includes a doped region 635 that is formed in a blanket layer 640 of the primary material as a result of interaction of region 530 with layer 640, for example, by titanium in region 530 removing oxygen from titanium dioxide in layer 640. Similarly, region 550 creates a doped region 655 in blanket layer 640. However, doped region 655 is at a top surface of layer 640, and doped region 635 is near a bottom surface of layer 640. The sizes of doped regions 635 and 655 illustrate the OFF-OFF state of switch 600.

Dopants from regions 635 and 655 can be caused to move through an application of sufficient bias voltage between electrodes 522 and 562, which changes the size of the doped regions 635 and 655 and creates electrical connections through layer 640. If electrode 522 is at a voltage sufficiently higher than the voltage on the electrode 562 above region 530, a drift of dopants (e.g., oxygen vacancies) from region 635 flows toward the overlying electrode 562 and can drastically change the conductivity of layer 640 between region 530 and the overlying electrode 562. The positive voltage on electrode 522 pushes the dopant of region 655 away from the bottom of layer 640, so that layer 640 is non-conductive between electrode 522 and region 550. If electrode 522 is at a voltage sufficiently lower than the voltage on the electrode 562 above region 530, an ion drill pulls dopants in region 635 toward region 530 and makes or keeps layer 640 non-conductive between region 530 and electrode 562. The lower or negative voltage on electrode 522 pulls dopant of region 655 downward into layer 640, so that layer 640 can become conductive between electrode 522 and region 550.

Figure 7A:
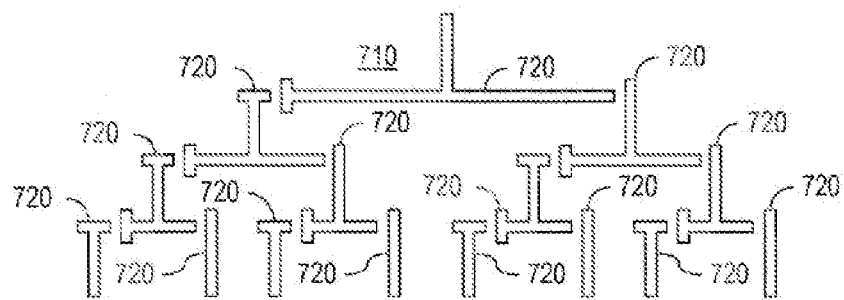
FIGS. 7A, 7B, and 7C are layout views illustrating a process for fabricating a serial decoder tree using horizontal deposition techniques.
Figure 7B:
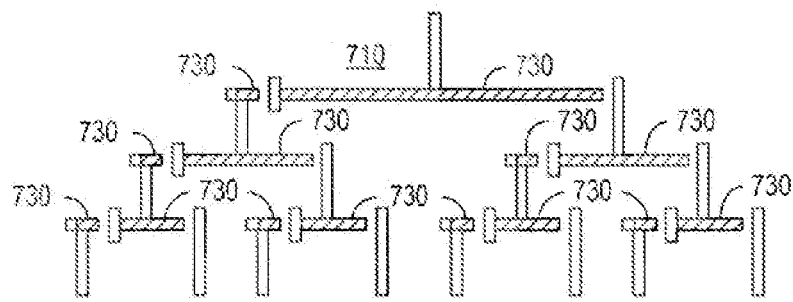
Figure 7C:
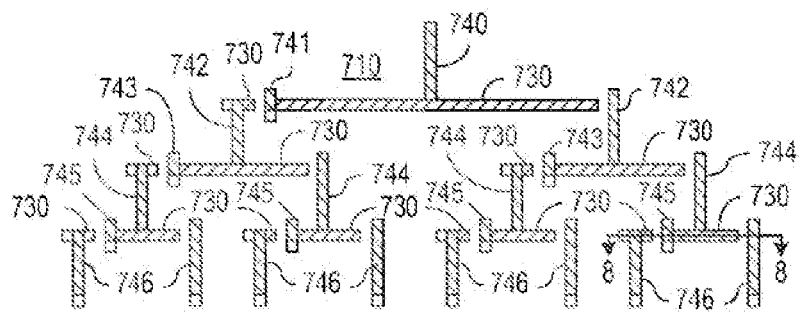

A tree structure can also use memristive switches that operate through horizontal ion drift. FIGS. 7A to 7C show plan views of structures that may be fabricated during manufacture of a tree structure including horizontal memristive switches. FIG. 7A in particular shows the layout of a shadow mask 710 that can be formed on a substrate having a top layer of a material such as titanium dioxide (TiO$_2$) that acts as the primary material of the memristive switches. Shadow mask 710 can be formed in a conventional process that spins on, imprints, and develops a resist material such as Polymethyl Methacrylate (PMMA) on top of the underlying substrate. Shadow mask 710 contains trenches 720 that expose the surface of the primary material in the underlying substrate. Trenches 720 have an aspect ratio such that a horizontal or directional deposition will not deposit material on a bottom of trenches that are narrow in the direction of the deposition. In an exemplary embodiment, shadow mask 710 is about 50~2000 nm thick and trenches 720 have a narrow width of about 20~200 nm.

FIG. 7B shows mask 710 after a directional deposition of a material that creates dopant source regions of the memristive switches. Directional deposition can be performed by E-beam evaporation. E-beam evaporation is a method of directional deposition, where no materials will be deposited on the back side or in the shadow of a blocking body. This directional deposition has a substantial west-to-east component, so that the material will not be deposited on the substrate within portions trenches 720 that are in the shadow of mask 710 (e.g., portions that are deep and narrow in the direction of the deposition) but will be deposited on the substrate along most of the length of portions of trenches 720 that extend in the cast-west direction in FIG. 7A. The directional deposition thus creates regions 730. Regions 730 would typically be thin (e.g., about 20 to 200 nm) compared to the thickness of mask 710 and are titanium that is deposited on titanium dioxide substrate in an exemplary embodiment of the invention.

FIG. 7C shows mask 710 after a second directional deposition of a conductive material such as chromium that is suitable for electrodes and that adheres well to the surface of the substrate. The second directional deposition is from a direction with a substantial south-to-north component. As a result, the conductive material is not deposited on portions of the substrate or regions 730 that are in the shadow of mask 710 (e.g., portions that are deep and narrow in the north-south direction). Regions 740 to 746 thus formed can be of approximately the same thickness as regions 730 and with the plan of mask 710 shown in FIG. 7C, will largely be on the substrate with little overlap onto regions 730.

In the embodiment of FIG. 7C, region 740 corresponds to the main terminal of a three-way switch in the root level of the tree structures, and region 741 is at the node separating the two memristive switches in the root-level three-way switch. Regions 742 correspond to the addressable terminals of the root-level, three-way switch. Regions 743 correspond to the nodes in separating memristive switches in the three-way switches at level 1 of the tree structure, and regions 744 correspond to the addressable terminals of the switches at level 1 in the tree structure. Regions 745 correspond to the nodes in separating memristive switches in the three-way switches at level 2 of the tree structure, and regions 746 correspond to the addressable terminals of the switches at level 2 in the tree structure.

Electrode material, e.g., platinum, can be deposited in trenches 720 using conventional vertical deposition techniques. In general, the deposition of an adhesion material described above with reference to FIG. 7C is optional, and electrode material can be deposited without first depositing an adhesion layer. Mask 710 can be removed after the electrodes are formed.

Figure 8:
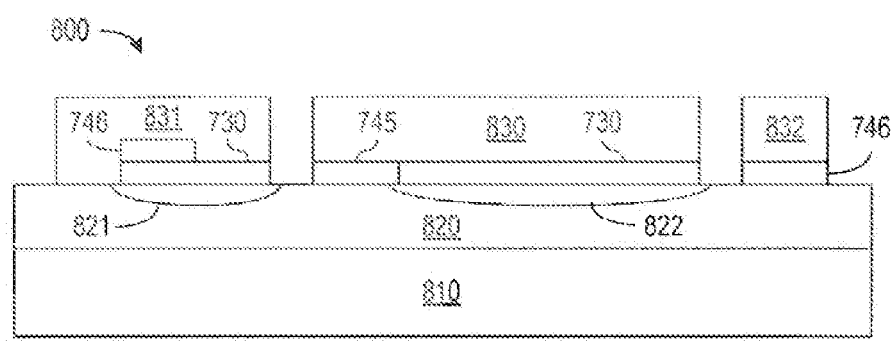
FIG. 8 shows a cross-sectional view of a three-way switch fabricated using the process illustrated in FIGS. 7A, 7B, and 7C.

FIG. 8 shows a cross-sectional view of a three-way switch 800 that corresponds to a portion of the tree structure indicated by the section line 8-8 in FIG. 7C after deposition of electrode material and removal of shadow mask 710. Switch 800 includes portions of a substrate 810 having a surface layer 820 of the primary material, e.g., of TiO$_2$. Regions 730 when deposited on layer 820 interact with the primary material, e.g., Ti reacts to introduce oxygen vacancies in TiO$_2$, and creates doped regions 821 and 822 of two separate memristive switches. A region 830 of the electrode material (e.g., platinum or platinum/chromium) corresponds to the main terminal of switch 800, and regions 831 and 832 of the electrode material correspond to the addressable terminals of switch 800.

A sufficient positive voltage on terminal 830 when regions 831 and 832 are grounded can repel positive polarity dopants in region 821 from terminal 830 and push ion dopants to expand region 822 horizontally toward electrode region 832. A sufficient positive voltage on region 830 can thus create a conductive path in layer 820 between the main terminal of switch 800 and the addressable terminal corresponding to electrode region 832. Similarly, a sufficient negative voltage on terminal 830 when regions 831 and 832 are grounded can attract positive polarity dopants in region 821 horizontally toward electrode 830 and pull ion dopants in region 822 away from electrode region 832, so that a negative voltage on region 830 can create a conductive path in layer 820 between the main terminal of switch 800 and the addressable terminal corresponding to electrode region 832.

Switch 800 can be connected to thin-film circuitry that is fabricated in layers overlying the structure shown in FIG. 8. In particular, grounding transistors such as transistors 122 and 124 of FIG. 1 and biasing transistors such as transistors 126 and 128 of FIG. 1 can be fabricated in layers overlying the structure of FIG. 8 and electrically connected to addressable terminals 831 and 832.

Although the invention has been described with reference to particular embodiments, the description is only an example of the invention's application and should not be taken as a limitation. For example, although the above embodiments employ $TiO_2$ as a primary material for memristive switches and Ti to create doped regions in those switches, alternative embodiments of the invention can employ other materials to achieve the functions described above. For example, some combinations of primary/dopant source materials suitable for memristive switches include but are not limited to $TiO_2/TiO_{2-x}$, $ZrO_{2-x}/ZrO_{2-x}$, $HfO_2/HfO_{2-x}$, $SrTiO_3/SrTiO_{3-x}$, $GaN/GaN_{1-x}$, $CuCl/CuCl_{1-x}$, and $GaN/GaN{:}S$. Additionally, the polarities and magnitudes of applied voltages and the levels of reference voltages such as ground can be altered as desired according to the design, dimensions, and materials employed in different embodiments of the invention. Various other adaptations and combinations of features of the embodiments disclosed are within the scope of the invention as defined by the following claims.

What is claimed is:

1. A decoding structure comprising:
   a main terminal;
   a first memristive switch connected between the main terminal and a first addressable terminal; and
   a second memristive switch connected between the main terminal and a second addressable terminal, wherein
   the second memristive switch is oriented so that a voltage polarity on the main terminal that tends to turn on the first memristive switch tends to turn off the second memristive switch.

2. The structure of claim 1, further comprising:
   a first transistor coupled between the first addressable terminal and a reference voltage; and
   a second transistor coupled between the second addressable terminal and the reference voltage.

3. The structure of claim 2, further comprising:
   a third transistor coupled between the first addressable terminal and a first bias voltage; and
   a fourth transistor coupled between the second addressable terminal and a second bias voltage, wherein the second bias voltage relative to the reference voltage is opposite in polarity to the first bias voltage relative to the reference voltage.

4. The structure of claim 1, further comprising:
   a first transistor coupled between the first addressable terminal and a positive bias voltage; and
   a second transistor coupled between the second addressable terminal and a negative bias voltage.

5. The structure of claim 1, further comprising:
   a third memristive switch connected between the first addressable terminal and a third addressable terminal;
   a fourth memristive switch connected between the first addressable terminal and a fourth addressable terminal;
   a fifth memristive switch connected between the second addressable terminal and a fifth addressable terminal; and
   a sixth memristive switch connected between the second addressable terminal and a sixth addressable terminal.

6. The structure of claim 1, wherein the structure has an OFF-OFF state in which the first memristive switch has a doped region adjacent to the first addressable terminal, and the second memristive switch has a doped region adjacent to the main terminal.

7. A structure of claim 1, wherein the structure is a decoder tree comprising:
   a root level which includes a three-way switch that contains the main terminal and the first memristive switch, and the second memristive switch; and
   one or more higher levels, wherein each of the higher levels includes multiple three-way switches, each of the three-way switches in the level having a main terminal coupled to an addressable terminal of one of three-way switches in an immediately lower level of the decoder tree structure.

8. The structure of claim 7, wherein each of the three-way switches in the decoder tree comprises:
   a main terminal;
   a first memristive switch connected between the main terminal and a first addressable terminal; and
   a second memristive switch connected between the main terminal and a second addressable terminal, and wherein
   in each of the three-way switches, the second memristive switch is oriented so that a voltage polarity on the main terminal that tends to turn on the first memristive switch tends to turn off the second memristive switch.

9. A method for fabricating the structure of claim 8, comprising:
   forming first regions that include a conductive region corresponding to the main terminal of the three-way switch in the root level of the tree structure and conductive regions respectively corresponding to the first and second addressable terminals of the three-way switches in a first level of the tree structure;
   forming second regions on portions of the first regions that correspond to the first memristive switches in the tree-way switches in the root level and the first level of the tree structure;
   depositing a layer of a primary material of the memristive switches over the second regions;
   forming third regions on portions of the layer of the primary material that correspond to the second memristive switches in the tree-way switch in the root level and the first level of the tree structure; and
   forming fourth regions including conductive regions that respectively correspond to the main terminals of the three-way switches in the first level of the tree structure.

10. The method of claim 9, wherein the layer of primary material comprises titanium dioxide, and the second regions and the third regions form oxygen vacancies in the titanium dioxide.

11. A method for fabricating the structure of claim 1, comprising:
    forming a mask on a layer of a first material that is suitable for a primary material of memristive switches, the mask including trenches having first portions extending along a first direction and second portions extending along a second direction;
    performing a directional deposition of a second material in a direction such that the second material deposits on the first material in the first portions of the trenches and is prevented by the mask from depositing on the first material in the second portions of the trenches, wherein the second material on the first material creates dopant source regions of the first and second memristive switches; and depositing an electrode material in the trenches to form the main terminal, the first addressable terminal, and the second addressable terminal.

12. The method of claim 1 further comprising performing a directional deposition of a third material in a direction such that the third material deposits on the first material in the second portions of the trenches and is prevented by the mask from depositing on the first material in the first portions of the trenches, wherein the third material improves adhesion of the electrode material.

13. A method for decoding a serial address, the method comprising:
applying to a first terminal, a signal with a polarity selected according to a first bit of the serial address;
grounding a second terminal of a first memristive switch that is coupled between the first terminal and the second terminal, wherein the first memristive switch is oriented so that the signal having a first polarity state tends to turn off the first memristive switch, and the signal having a second polarity state tends to turn on the first memristive switch;
grounding a third terminal of a second memristive switch that is coupled between the first terminal and the third terminal, wherein the second memristive switch is oriented so that the signal having the first polarity state tends to turn on the second memristive switch, and the signal having the second polarity state tends to turn off the second memristive switch; and
maintaining the signal at the polarity selected according to the first bit of the serial address until one of the first and second memristive switches is on and another of the first and second memristive switches is off.

14. The method of claim 13, further comprising:
applying to the first terminal, the signal with a polarity selected according to a second bit of the serial address, wherein the one of the first and second memristive switches that is on conducts the signal to a fourth terminal;
grounding a fifth terminal of a third memristive switch that is coupled between the fourth terminal and the fifth terminal, wherein the third memristive switch is oriented so that the signal having the first polarity state tends to turn off the first memristive switch, and the signal having the second polarity state tends to turn on the first memristive switch;
grounding a sixth terminal of a fourth memristive switch that is coupled between the fourth terminal and the sixth terminal, wherein the fourth memristive switch is oriented so that the signal having the first polarity state tends to turn on the fourth memristive switch, and the signal having the second polarity state tends to turn off the fourth memristive switch; and
maintaining the signal at the polarity selected according to the second bit of the address signal until one of the third and fourth memristive switches is off and another of the third and fourth memristive switches is off.

15. The method of claim 14, wherein:
the first and second memristive switches are parts of a three-way switch in a root level of a multi-level tree structure; and
the third and fourth memristive switches are parts of one of two three-way switches in a first level of the multi-level tree structure.

* * * * *

UNITED STATES PATENT AND TRADEMARK OFFICE
CERTIFICATE OF CORRECTION

PATENT NO. : 8,437,172 B2  
APPLICATION NO. : 13/142580  
DATED : May 7, 2013  
INVENTOR(S) : Fiorentino et al.

Page 1 of 1

It is certified that error appears in the above-identified patent and that said Letters Patent is hereby corrected as shown below:

In the Claims:

In column 11, line 4, in Claim 12, delete "claim 1" and insert -- claim 11, --, therefor.

Signed and Sealed this  
First Day of October, 2013

Teresa Stanek Rea  
*Deputy Director of the United States Patent and Trademark Office*